United States Patent
Wang et al.

(10) Patent No.: US 7,903,466 B2
(45) Date of Patent: Mar. 8, 2011

(54) MEMORY DEVICE AND METHOD OF OPERATING THE SAME

(75) Inventors: Jong Hyun Wang, Cheongju-si (KR); Duck Ju Kim, Icheon-si (KR); Seong Hun Park, Gunsan-si (KR); Chang Won Yang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 534 days.

(21) Appl. No.: 11/966,007

(22) Filed: Dec. 28, 2007

(65) Prior Publication Data
US 2008/0205138 A1 Aug. 28, 2008

(30) Foreign Application Priority Data
Feb. 22, 2007 (KR) .................. 10-2007-0017924
Sep. 17, 2007 (KR) .................. 10-2007-0094134

(51) Int. Cl.
*G11C 16/04* (2006.01)
(52) U.S. Cl. .................. 365/185.21; 365/185.03
(58) Field of Classification Search ............ 365/185.21, 365/185.03, 185.17, 185.25
See application file for complete search history.

(56) References Cited

U.S. PATENT DOCUMENTS

| 7,551,492 B2 * | 6/2009 | Kim ............ 365/185.29 |
| 2005/0185468 A1 | 8/2005 | Hosono et al. |
| 2005/0265079 A1 | 12/2005 | Shirota |

FOREIGN PATENT DOCUMENTS

KR   1020060070734 A   6/2006

* cited by examiner

*Primary Examiner*—Vu A Le
(74) *Attorney, Agent, or Firm*—Kilpatrick Townsend and Stockton LLP

(57) ABSTRACT

A memory device has memory cells that are Multi-Level Cells (MLCs). A memory cell array includes a plurality of cell strings, each string provided between a bit line and a common source line, wherein a positive voltage is applied to the common source line at the time of program verification. A page buffer is configured to program the MLCs, read memory cells, and perform program verification. This program verification is performed by sequentially increasing a voltage level of a bit line select signal until the bit line select signal reaches to a voltage that is sufficient to verify a programmed state of a selected cell in the memory cell array.

5 Claims, 7 Drawing Sheets

MEMORY DEVICE AND METHOD OF OPERATING THE SAME

CROSS-REFERENCES TO RELATED APPLICATIONS

The present application claims priority to Korean Patent Application No. 10-2007-017924, filed on Feb. 22, 2007 and Korean Patent Application No. 10-2007-094134, filed on Sep. 17, 2007, which are incorporated by reference in its entirety.

BACKGROUND OF THE INVENTION

The present invention relates to an operating method of a memory device and, more particularly, to a memory device and a program verify method, in which the number of program verifications for a Multi-Level Cell (hereinafter, referred to as "MLC") can be reduced.

A well-known NAND flash memory device includes a memory cell array, a row decoder and a page buffer. The memory cell array includes a plurality of cell strings intersected by a plurality of word lines, extending along the rows, and a plurality of bit lines and the bit lines, extending along the columns.

The row decoder connected to a string select line, word lines and a common source line is disposed on one side of the memory cell array, and the page buffer connected to a plurality of bit lines is disposed on the other side of the memory cell array.

In recent years, in order to further improve the level of integration of flash memory, active research has been done on a MLC capable of storing a plurality of data bits in one memory cell. This type of a memory cell is referred to as a MLC. A memory cell configured to store a single bit is referred to as a Single Level Cell (hereinafter, referred to as "SLC").

FIG. 1a shows cell distributions of a SLC memory device.

Referring to FIG. 1a, the SLC has distributions of two cell states 101 and 102. In the SLC, the erase cell state 101 basically moves to the program cell state 102 according to the program operation (S110). The SLC requires one program operation as illustrated in FIG. 1a, and can complete the verify operation by performing one verification using verify voltage PV.

FIG. 1b shows cell distributions of a MLC memory device.

FIG. 1b also illustrates cell distributions of a MLC capable of storing 2-bit data. The MLC memory device has cell states 111 to 114 respectively representing data storage states [11], [10], [00] and [01]. The cell distributions correspond to threshold voltage distributions of the MLC.

Further, programming each cell includes performing a Least Significant Bit (LSB) program (S121) to program the cell into the state [10], and a Most Significant Bit (MSB) program includes programming the state [10] into the state [00] (S131) or the state [11] into the state [01] (S132).

After programming, verification is performed. In general, as the number of data bits that can be stored increases, cell distributions are increased. Thus, the number of verifications is also increased.

As mentioned above, in the case of the SLC, once verification is performed on a program 1 pulse. However, in the case of the MLC capable of storing 2-bit data as illustrated in FIG. 1b, two verifications are required on a program 1 pulse in the MSB program. In this manner, a 3-bit MLC requires three verifications on the program pulse, and a 4-bit MLC requires four verifications.

From the following Equation 1, it can be seen that as the number of verifications increases, the program time increases.

$$T_{pgm} = (t_{PGM} + t_{V_{fy}} \times N_{V_{fy}}) \times N_{pgm} \tag{1}$$

where $T_{pgm}$ is the total program time, $t_{PGM}$ is the program pulse time, $t_{V_{fy}}$ is the verification time, $N_{V_{fy}}$ is the number of verifications per program pulse, and $N_{pgm}$ is the number of applied program pulses.

As illustrated in Equation 1, as the number of verifications increases, the program time is lengthened, affecting the efficiency of a memory device.

SUMMARY OF THE INVENTION

The present invention is directed towards a memory device and a method of operating the same, in which the program time can be saved by reducing a verification or read time in an operation of a memory device including a MLC.

According to an aspect of the present invention, a memory device having a MLC includes a memory cell array, a plurality of page buffers, and a verify controller. The memory cell array includes a plurality of cell strings connected to each of bit lines and a common ground line, respectively, and is configured to provide a positive voltage to the common ground line upon program verification. The plurality of page buffers are configured to program the MLCs and read data stored in memory cells through the respective bit lines. The verify controller connects a bit line and the page buffer according to a voltage level precharged to the bit line at the time of a program verify or data read operation of a memory cell, so that the page buffer can determine a programmed state of the memory cell.

According to another aspect of the present invention, a program verify method of a memory device including a MLC includes performing programming on MLCs of the memory device, applying a power supply voltage to a ground line commonly connected to cell strings to which the MLCs are connected for program verification, applying a first voltage to a selected word line of a plurality of word lines connected to intersect the cell strings of the MLCs and applying a pass voltage to unselected word lines, precharging each of bit lines, sequentially applying a bit line select signal to a gate of a transistor connected between the bit line and a page buffer according to a preset voltage level, and confirming a verify signal of the page buffer, which is output according to each voltage level, and determining whether the MLCs have been programmed according to a voltage level of the bit line select signal on which the verify signal is output based on the confirmation result.

DESCRIPTION OF SPECIFIC EMBODIMENTS

A specific embodiment according to the present patent will be described with reference to the accompanying drawings.

Figure 1A:
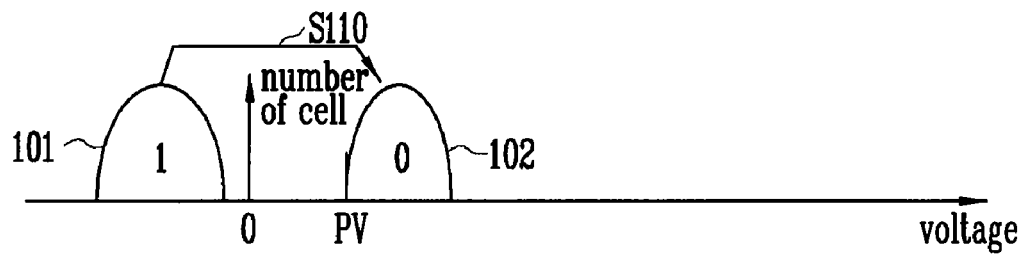
FIG. 1a shows cell distributions of a SLC memory device.
Figure 1B:
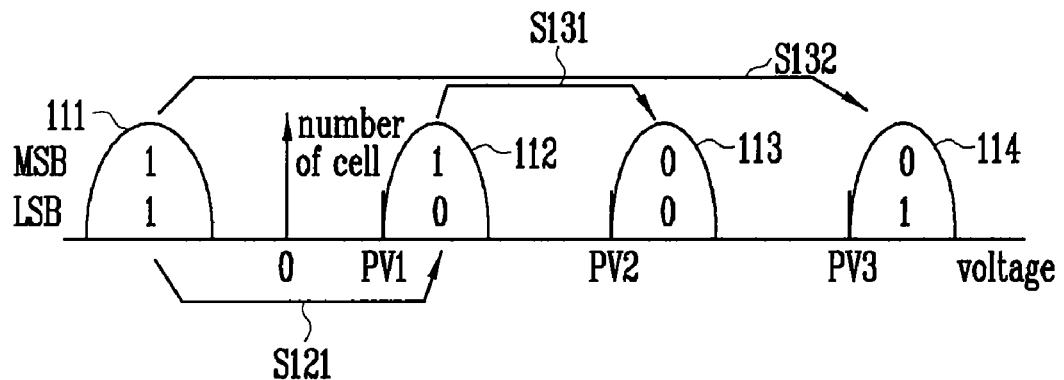
FIG. 1b shows cell distributions of a MLC memory device.
Figure 2A:
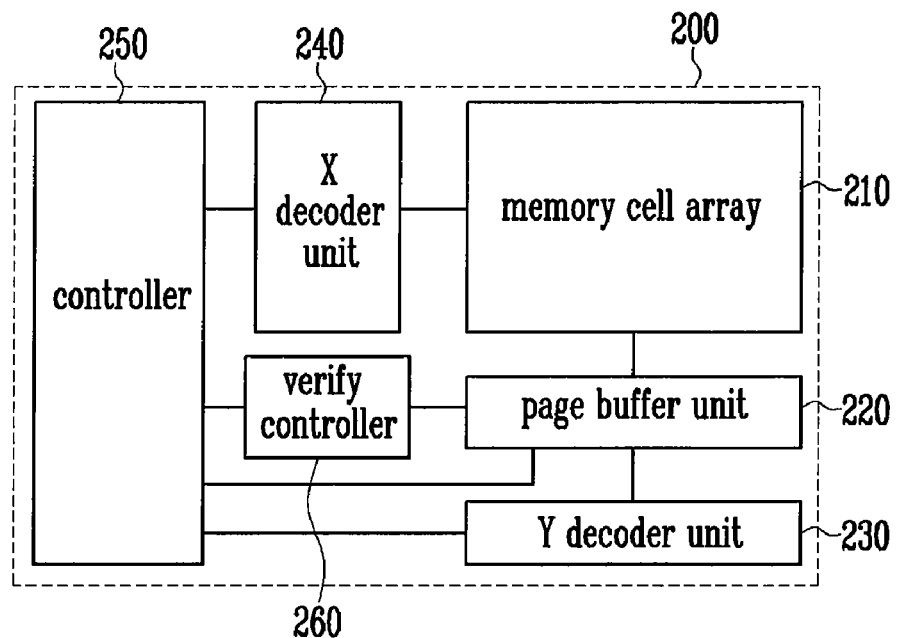
FIG. 2a is a block diagram showing the structure of a MLC memory device according to an embodiment of the present invention.

Referring to FIG. 2a, a MLC memory device 200 according to an embodiment of the present invention includes a memory cell array 210 having MLCs, a page buffer unit 220 including a plurality of page buffers for performing data program, verify and read operations on the memory cell array 210, a Y decoder unit 230 for selecting the plurality of page buffers in response to an input address, a X decoder unit 240 for selecting word lines of the memory cell array 210 in response to an input address, and a controller 250 for controlling the operation of the MLC memory device 200, and a verify controller 260 for controlling the page buffers of the page buffer unit 220 to read a data state according to a precharge voltage level of a bit line connected to a memory cell.

The memory cell array 210 includes MLCs in which word lines and bit lines are defined. The page buffer unit 220 includes one or more page buffers, where each page buffer is connected to a pair of bit lines of the memory cell array 210 and configured to perform program, verify and read operations on the memory cells.

The Y decoder unit 230 and the X decoder unit 240 are used to select MLCs for a program or read operation under the control of the controller 250.

The controller 250 controls a voltage level for a program verify or read operation and an erase operation, an operating signal, etc.

Further, at the time of program verification of the memory cell array 210 according to an embodiment of the present invention, the controller 250 applies voltage VDC, which has been regulated to a specific level, to a common source line, and controls the verify operation, so that the number of verifications and the program time can be reduced.

The verify controller 260 connects a bit line and a page buffer according to a voltage level precharged to the bit line and a voltage level of a control signal applied thereto under the control of the controller 250. Thus, the page buffer verifies or reads data stored in the memory cell.

This operation will be described in detail with reference to the following drawings.

Figure 2B:
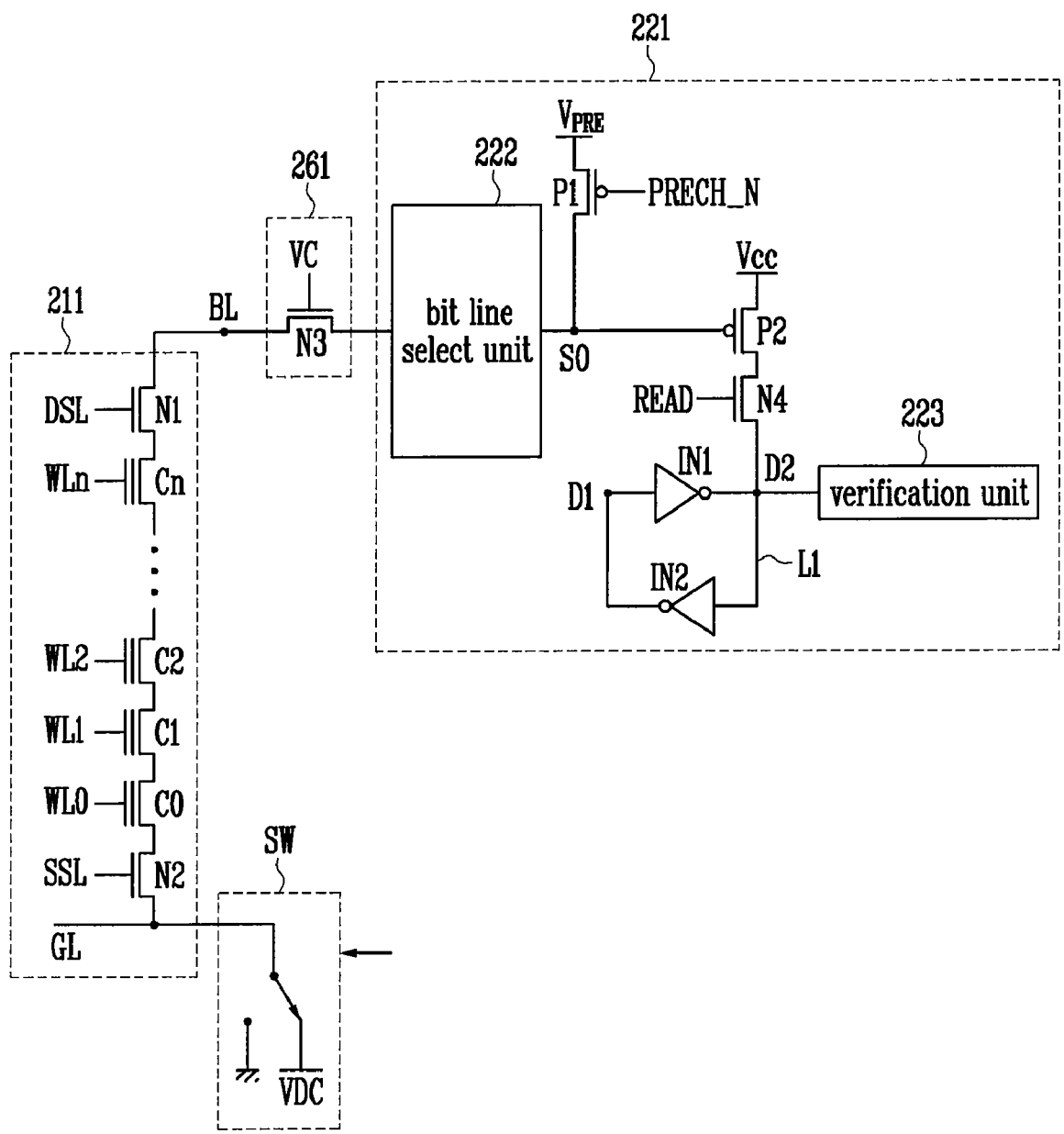
FIG. 2b is a circuit diagram of a memory cell array of FIG. 2a and a page buffer according to a first embodiment.

FIG. 2b is a circuit diagram of the memory cell array of FIG. 2a and a page buffer according to a first embodiment.

FIG. 2b is a circuit diagram illustrating one cell string 211 of the memory cell array 210 concerned with a program verify operation, part (261) of the verify controller 260 connected between a bit line BL connected to the cell string 211 and the page buffer unit 220, one page buffer 221 of the page buffer unit 220, and part of a switch circuit SW, of the MLC memory device 200 shown in FIG. 2a.

Referring to FIG. 2b, the cell string 211 includes first and second NMOS transistors N1 and N2, and first to $(n+1)^{th}$ cells C0 to Cn. The verify controller 261 includes a third NMOS transistor N3. The page buffer 221 includes a bit line select unit 222, a fourth NMOS transistor N4, first and second PMOS transistors P1 and P2, first and second inverters IN1 and IN2, and a verification unit 223. The switch circuit SW is connected to a common source line GL of the cell string 211, so that a voltage VDC, which has been regulated to a specific level, or a ground voltage is connected to the common source line GL according to a control signal.

The control signal is input from the controller 250 of the MLC memory device 200. If the control signal is input upon program verification, the switch circuit SW connects the voltage VDC to the common source line GL. The switch circuit SW connects the ground voltage to the common source line GL when program verification is not performed.

The cell string 211 includes the cells C0 to Cn connected in series between the first NMOS transistor N1 and the second NMOS transistor N2. The first NMOS transistor N1 is connected between the $(n+1)^{th}$ cell Cn and the bit line BL, and is driven in response to a drain select line signal DSL.

Furthermore, the second NMOS transistor N2 is connected between the first cell C0 and the common source line GL, and is driven in response to a source select line signal SSL. The cells C0 to Cn are selected by word lines WL1 to WLn. The third NMOS transistor N3 of the verify controller 261 is connected between the bit line BL and a sensing node SO, and is driven in response to a verify control signal VC.

The bit line select unit 222 of the page buffer unit 221 selects a bit line, including a memory cell for data program or data read, from an even bit line BLe and an odd bit line BLo. In an embodiment of the present invention, the verify controller 221 is constructed separately. It is, however, to be noted that the bit line select unit 222 included in the page buffer 221 may be constructed to perform the same function as that of the verify controller 221 by changing the voltage level of a bit line select signal.

Further, the first PMOS transistor P1 is connected between a precharge voltage $V_{PRE}$ and the sensing node SO, and is driven in response to a precharge signal PRECH_N.

The second PMOS transistor P2 and the fourth NMOS transistor N4 are connected in series between a power supply voltage VDC and a second node D2, and the gate of the second PMOS transistor P2 is connected to the sensing node SO. Further, the gate of the fourth NMOS transistor N4 is connected to a read signal READ.

A first latch L1 consisting of the first and second inverters IN1, IN2 is connected between a first node D1 and the second node D2. The second node D2 is connected to the verification unit 223, so that whether programming has been verified can be determined. The verification unit 223 may be comprised of a transistor that is turned on or off according to a voltage level of the second node D2. Accordingly, a verify signal output from the verification unit 223 is input to the controller 250 and therefore verification can be determined.

Program verification of the page buffer according to a first embodiment of the present invention may be performed as follows.

It is first assumed that the program operation has already been performed according a general program operation. It is also assumed that in the case of a 2-bit MLC, distribution states of the threshold voltage include four states [11], [10], [00] and [01].

Assuming that in the cell string 211 of FIG. 2b, a [00] data program is performed on the first cell C0 and is then verified, the first node D1 of the first latch L1 is reset to a high level by means of a reset operation for verification. In this case, the reset operation is performed using a circuit of an additional page buffer, which is not illustrated in FIG. 2b, according to an embodiment of the present invention.

Further, the precharge signal PRECH_N is applied to precharge the sensing node SO with a precharge voltage.

The signals DSL and SSL for turning on or off the first and second NMOS transistors N1 and N2 of the cell string 211 are then applied. A pass voltage is applied to unselected word lines WL1 to WLn, which have not been verified, thereby turning on the cells.

A voltage for verification, which is higher than the highest threshold voltage of a programmed cell, is applied to a selected word line WL0. The highest threshold voltage is associated with the state [01]. Accordingly, the high voltage applied to the selected word line WL0 is higher than the threshold voltage associated with the state [01].

In more detail, for example, three verify voltages P1, P2 and P3 (P1<P2<P3) are generally used to verify programming of MLCs having four threshold voltage distributions [11], [10], [00] and [01]. Therefore, the first cell C0 selected according to an embodiment of the present invention is applied with a sufficiently high voltage, so that the bit line can be precharged irrespective of a programmed state of the first cell C0. If the voltage applied to the first cell C0 is not sufficiently high (i.e., lower than the highest threshold voltage), the first cell C0 may not turn on. In such a case, the precharging of the bit line according to an embodiment of the present invention may be difficult. Therefore, in order to turn on all the cells that will be verified, including a cell that is programmed with [01] (i.e., the highest threshold voltage distribution), a sufficiently high verify voltage is applied to the selected word line.

Meanwhile, the verify voltage having a sufficiently high voltage level is applied to a selected word line, and the pass voltage is applied to unselected word lines. Furthermore, the switch circuit SW that has received the control signal from the controller 250 according to the program verification operation connects the common source line GL to the voltage VDC that has been regulated to a specific level.

If voltage is applied to the cell string 211 as described above, the bit line BL is precharged to the power supply voltage applied to the common source line GL. In this case, the precharged voltage level is set according to a programmed state of a cell connected to a selected word line.

That is, if the cell has not been programmed with the state [11], the cell is turned on by means of the voltage applied to the gate except for the cells having the lowest threshold voltage value, so that most of the voltage VDC is applied to the bit line BL. However, the cells that have been programmed more extensively are less likely to be turned on, and therefore voltage applied to the bit line BL may be lower than the power supply voltage.

The first cell C0 according to an embodiment of the present invention is a cell programmed with the state [00]. Thus, the cell is turned on slightly by the verify voltage applied to the gate, so that the bit line BL is precharged to only a low voltage.

After the bit line BL is precharged, the voltage level of the verify control signal VC applied to the gate of the third NMOS transistor N3 of the verify controller 261 is slowly raised from a minimum sensing voltage level. The bit line select unit 222 of the page buffer 221 is connected between the sensing node SO and one terminal of the third NMOS transistor N3.

The sensing voltage level of the changed verify control signal VC is changed in order of a first sensing voltage $V_{s1}$ for verifying the state [01], a second sensing voltage $V_{s2}$ for verifying the state [00], and a third sensing voltage $V_{s3}$ for verifying the state [10].

The cell states having high threshold voltages, e.g., the state [10], are applied with a low sensing voltage above because the precharged level of the bit line tends to be lowered if the bit line is connected to the cells having high threshold voltage.

Therefore, if the first sensing voltage $V_{s1}$ is applied as the verify control signal VC, the voltage level of the first sensing voltage $V_{s1}$ is lower than the voltage level of the bit line BL, so that the third NMOS transistor N3 is not turned on. Thus, the sensing node SO maintains the precharge voltage $V_{PRE}$, and the second PMOS transistor P2 keeps in a turn-off state.

Further, if the voltage level of the verify control signal VC is higher than that of the second sensing voltage $V_{S2}$, the voltage of the bit line BL is lower than the second sensing voltage $V_{S2}$, so the third NMOS transistor N3 is turned on.

If the third NMOS transistor N3 is turned on, the precharged sensing node SO is shared due to the low voltage of the bit line BL and the voltage level is lowered accordingly. If the voltage of the sensing node SO is lowered, the second PMOS transistor P2 is turned on.

Accordingly, if the read signal READ is applied, the second node D2 shifts from a low level to a high level and the first node D1 shifts from a high level to a low level. The verification unit 223 connected to the second node D2 senses the state change of the second node D2 and outputs a verify signal to the controller. Thus, it can be verified that the first cell C0 has been programmed with the state [00].

As described above, the threshold voltage of a cell is varied according to a programmed state and, therefore, the sensing voltage level precharged by the bit line is changed. Accordingly, the programmed state of the cell can be verified by changing only a sensing voltage level of the verify control signal VC with respect to once verify pulse. At this time, since the programmed state of the cell is verified using a voltage level precharged by the bit line, the construction of the page buffer 221 is changed. In this case, in order to apply the above data read or verify method while minimizing the change of the circuit of the existing page buffer 221, the following alternative embodiment may be constructed.

Figure 2C:
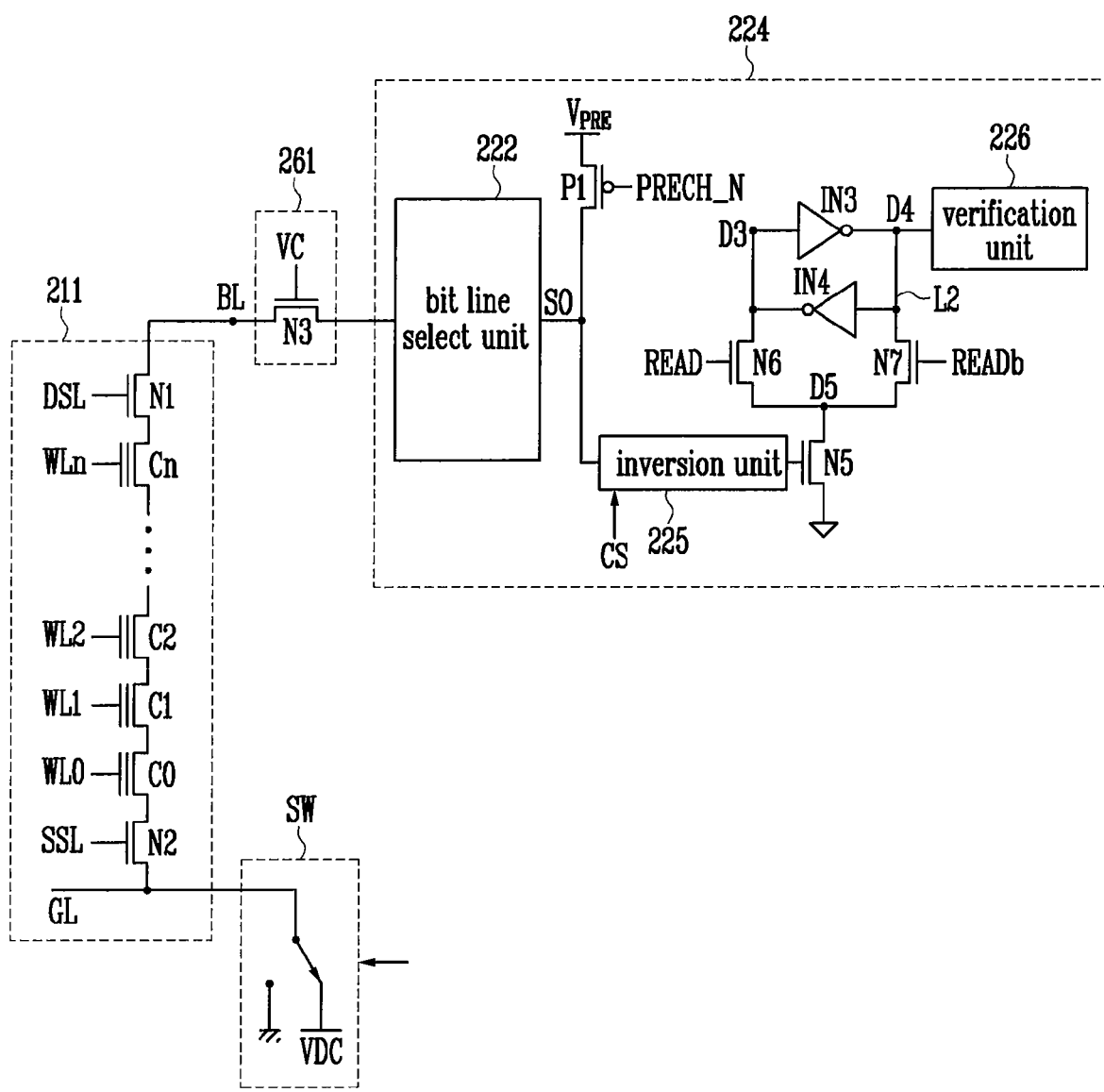
FIG. 2c is a circuit diagram of the memory cell array of FIG. 2a and a page buffer according to a second embodiment.

FIG. 2c is a circuit diagram of the memory cell array of FIG. 2a and a page buffer according to a second embodiment.

Referring to FIG. 2c, a page buffer 224 according to a second embodiment of the present invention is connected to a cell string 211 through a verify controller 261. The cell string 211, a switch SW and the verify controller 261 have the same construction and operation as those of the first embodiment of FIG. 2b and are also given the same reference numerals, and therefore description thereof will be omitted.

The page buffer 224 according to the present embodiment includes a bit line select unit 222, a first PMOS transistor P1, an inversion unit 225, fifth to seventh NMOS transistors N5 to N7, third and fourth inverters IN3 and IN4, and a verification unit 226.

The bit line select unit 222 and the first PMOS transistor P1 have the same construction and operation as those of the first embodiment of FIG. 2b and are also given the same reference numerals, and therefore description thereof will be omitted.

The inversion unit 225 inverts a voltage level of the sensing node SO and outputs an inverted signal. The fifth NMOS transistor N5 is connected between a fifth node D5 and a ground node, and the output of the inversion unit 225 is connected to the gate of the fifth NMOS transistor N5.

The inversion unit 225 is driven in response to a control signal CS of the controller 250. In response to the control signal CS, the inversion unit 225 may invert a voltage level of the sensing node SO and output an inverted signal, or simply connect the sensing node SO to the gate of the fifth NMOS transistor N5. In other words, upon data verification or read, the inversion unit 225 may perform an inversion operation, and upon initial operation, the inversion unit 225 may provide a voltage level of the sensing node SO to the fifth NMOS transistor N5 without change at the time of an operation such as an operation for resetting a second latch L2.

The third and fourth inverters IN3 and IN4 are connected between a third node D3 and a fourth node D4, thus constituting the second latch L2. The sixth NMOS transistor N6 is connected between the node D3 and the node D5. The gate of the sixth NMOS transistor N6 is applied with a read signal READ.

Further, the seventh NMOS transistor N7 is connected between the fourth node D4 and the fifth node D5, and the gate of the seventh NMOS transistor N7 is applied with a read inversion signal READb. The read inversion signal READb is an inverted signal of the read signal READ.

The verification unit 226 outputs a verify signal according to a change of a voltage level of the fourth node D4. The verify signal is transferred to the controller 250, so a programmed state can be verified.

The page buffer 224 is driven as follows in order to verify or read data of a memory cell. In general, in the operation of a flash memory device, a verify operation and a read operation are executed similarly and, therefore, only the program verify operation is described below.

In order for the page buffer 224 to read data of a memory cell, the precharge control signal PRECH_N is applied to turn on the first PMOS transistor P1, so the sensing node SO is precharged.

Signals DSL and SSL for turning off first and second NMOS transistors N1 and N2 of the cell string 211 are then applied, and a pass voltage is applied to unselected word lines WL1 to WLn on which verification has not been performed, thus turning on cells.

A voltage for verification, which is higher than the highest threshold voltage of a programmed cell, is applied to a selected word line WL0. That is, in the case of a 2-bit MLC, a voltage that can be precharged to the bit line even in the case of the state [01] having the highest threshold voltage is applied. In other words, a memory cell having the state [01] is turned on to some extent and, therefore, the bit line is precharged.

More specifically, for example, three verify voltages P1, P2 and P3 (P1<P2<P3) are generally used to verify programming of MLCs having four threshold voltage distributions [11], [10], [00] and [01]. Thus, a first cell C0 selected according to an embodiment of the present invention is applied with a high voltage to the extent that even cells verified using the voltage P3 can be turned on and the bit line can be precharged accordingly. The reason why such a high voltage is applied to the word line is that if a voltage level applied to a selected word line is too low, cells with high threshold voltage distributions are not turned on according to the characteristic of a flash memory device on which program and verification are performed on a page basis, and in this case, precharging of the bit line according to an embodiment of the present invention is difficult. Therefore, in order to turn on all cells that will be verified, including a cell that is programmed with the state [01] having the highest threshold voltage distributions, a high verify voltage is applied to the selected word line.

Meanwhile, the selected word line is applied with a verify voltage having a high voltage level (that is, a voltage enough to turn on cells that are verified using the voltage P3), and unselected word lines are applied with a pass voltage. Furthermore, a switch circuit SW that has received a control signal from the controller 250 according to the program verification operation connects a common source line GL to the voltage VDC that has been regulated to a specific level.

If voltage is applied to the cell string 211 as described above, the bit line BL is precharged to the power supply voltage applied to the common source line GL. In this case, the precharged voltage level may be changed according to a programmed state of a cell connected to a selected word line.

That is, if a cell has not been programmed with the state [11], the cell is turned on by means of the voltage applied to the gate and almost all the voltage VDC except for a minimum threshold voltage is applied to the bit line BL. However, cells that have been programmed more extensively are less likely to be turned on, and therefore the voltage applied to the bit line BL may be lower than the power supply voltage.

After the bit line BL is precharged, the voltage level of the verify control signal VC applied to the gate of the third NMOS transistor N3 of the verify controller 261 is slowly raised from a minimum sensing voltage level. The bit line select unit 222 of the page buffer 221 connects the sensing node SO and the third NMOS transistor N3.

The sensing voltage level of the changed verify control signal VC is changed in order of a first sensing voltage $V_{s1}$ for verifying the state [01], a second sensing voltage $V_{s2}$ for verifying the state [00], and a third sensing voltage $V_{s3}$ for verifying the state [10].

Meanwhile, the reason why a low sensing voltage is applied to a cell having the above high threshold voltages is that the voltage level precharged to the bit line BL tends to be lowered if the bit line BL is connected to a cell having a higher threshold voltage.

Therefore, if the first sensing voltage $V_{s1}$ is applied as the verify control signal VC, the voltage level of the first sensing voltage $V_{s1}$ is lower than the voltage level of the bit line BL, so that the third NMOS transistor N3 is not turned on. Thus, the sensing node SO maintains the precharge voltage $V_{PRE}$. The inversion unit 225 inverts the voltage level of the sensing node SO and inputs an inverted signal to the gate of the fifth NMOS transistor N5. Accordingly, the fifth NMOS transistor N5 keeps in a turn-off state.

Further, if the voltage level of the verify control signal VC is applied as the second sensing voltage $V_{s2}$, the voltage level of the bit line BL is lower than the second sensing voltage $V_{s2}$, so the third NMOS transistor N3 is turned on. Furthermore, the precharged sensing node SO is shared due to the low voltage of the bit line BL and, therefore, has a low voltage. The inversion unit 225 inverts the voltage level of the sensing node SO and inputs an inverted signal to the gate of the fifth NMOS transistor N5, and the fifth NMOS transistor N5 is turned on accordingly.

Therefore, if the read signal READ is applied, the third node D3 shifts from a high level to a low level and the fourth node D4 shifts from a low level to a high level. Thus, the value of the second latch L2 is changed. The verification unit 226 connected to the fourth node D4 senses this state change and thus provides a verify signal to the controller 250. The controller 250 can determine that the first cell C0 has been programmed with the state [00] based on the verify signal.

As described above, the threshold voltage of a cell is varied according to a programmed state and, therefore, the sensing voltage level precharged by the bit line is changed. Accordingly, the programmed state of the cell can be verified by changing only a sensing voltage level of the verify control signal VC with respect to once verify pulse. The page buffer 224 according to the second embodiment further includes the inversion unit 225, so that a change of the existing page buffer circuit can be minimized.

The inversion unit 225 may include inversion means having the following characteristics.

Figure 2D:
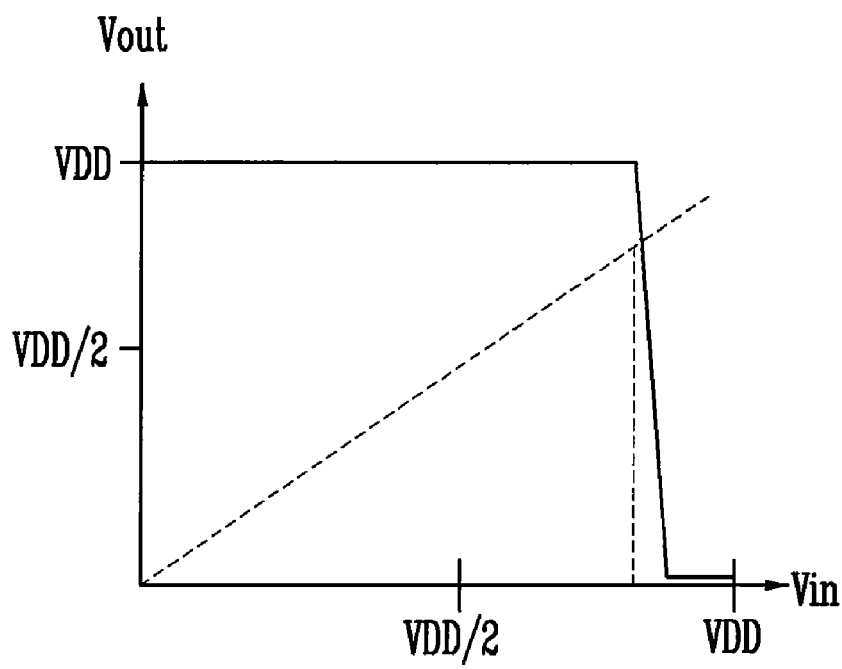
FIG. 2d is a graph illustrating characteristics of an inversion unit of FIG. 2c.

FIG. 2d is a graph illustrating characteristics of the inversion unit of FIG. 2c Referring to FIG. 2d, the inversion unit 225 may include inversion means having a high threshold voltage. The inversion means has the characteristic because even though the value of the sensing node SO drops a little when the sensing node SO is connected to the bit line with it being precharged, the inversion unit 225 has to sense such a drop and change its output.

More specifically, when a verify operation is performed, the sensing node SO is in a precharge state. At this time, the inversion unit 225 outputs a low level opposite to that of the sensing node SO, thus turning off the fifth NMOS transistor N5.

In the event that a memory cell that will be verified is programmed to have the lowest threshold voltage (for example, the memory cell is programmed with the state [10] in an embodiment of the present invention), the bit line BL is precharged to a relatively high voltage. Further, if the verify control signal VC is input as the highest sensing voltage $V_{s3}$, the third NMOS transistor N3 of the verify controller 261 is turned on and the sensing node SO is connected to the bit line BL. At this time, since the voltage level precharged by the sensing node SO is shared by the voltage of the bit line BL, the voltage level of the sensing node SO is lowered. A degree in which the voltage level of the sensing node SO is lowered is small. In order for the page buffer 224 to sense such lowering of the voltage level of the sensing node SO and thus perform verification, the inversion unit 225 has to sense the lowering of the voltage level of the sensing node SO and then invert the voltage level of the sensing node SO to a high level. For this reason, the inversion unit 225 has to be designed to have a high threshold voltage level. However, if the inversion unit 225 includes inversion means not having a high threshold voltage level, the inversion unit 225 cannot sense a change in the voltage level of the sensing node SO even when a memory cell is programmed with the state [10], so it may lead to error in verification. In accordance with the second embodiment of the present invention, the inversion means of the inversion unit 225 is designed to have a high threshold voltage sufficiently enough to verify even a memory cell that is programmed to have the lowest threshold voltage.

If the bit line is precharged using the method according to the first and second embodiment of the present invention, it is changed as follows in an operation of a data verify or read method.

Figure 3:
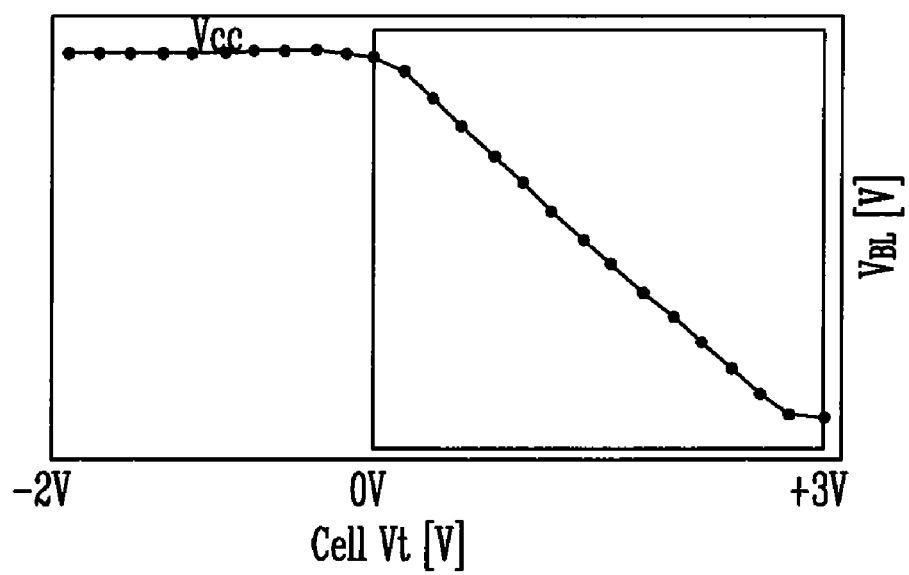
FIG. 3 is a graph illustrating bit line precharge levels depending on a change in cell voltage according to an embodiment of the present invention.

FIG. 3 is a graph illustrating bit line precharge levels depending on a change in cell voltage according to an embodiment of the present invention.

FIG. 3 shows a simulation result of the method in which the precharge level of the bit line BL is changed, which has been described with reference to FIG. 2b. The threshold voltage is changed according to a programmed state of a cell. The voltage $V_{BL}$ of the bit line is changed according to the change in the threshold voltage.

From FIG. 3, it can be seen that if the threshold voltage of a cell is increased, voltage precharged to the bit line is lowered.

Figure 4:
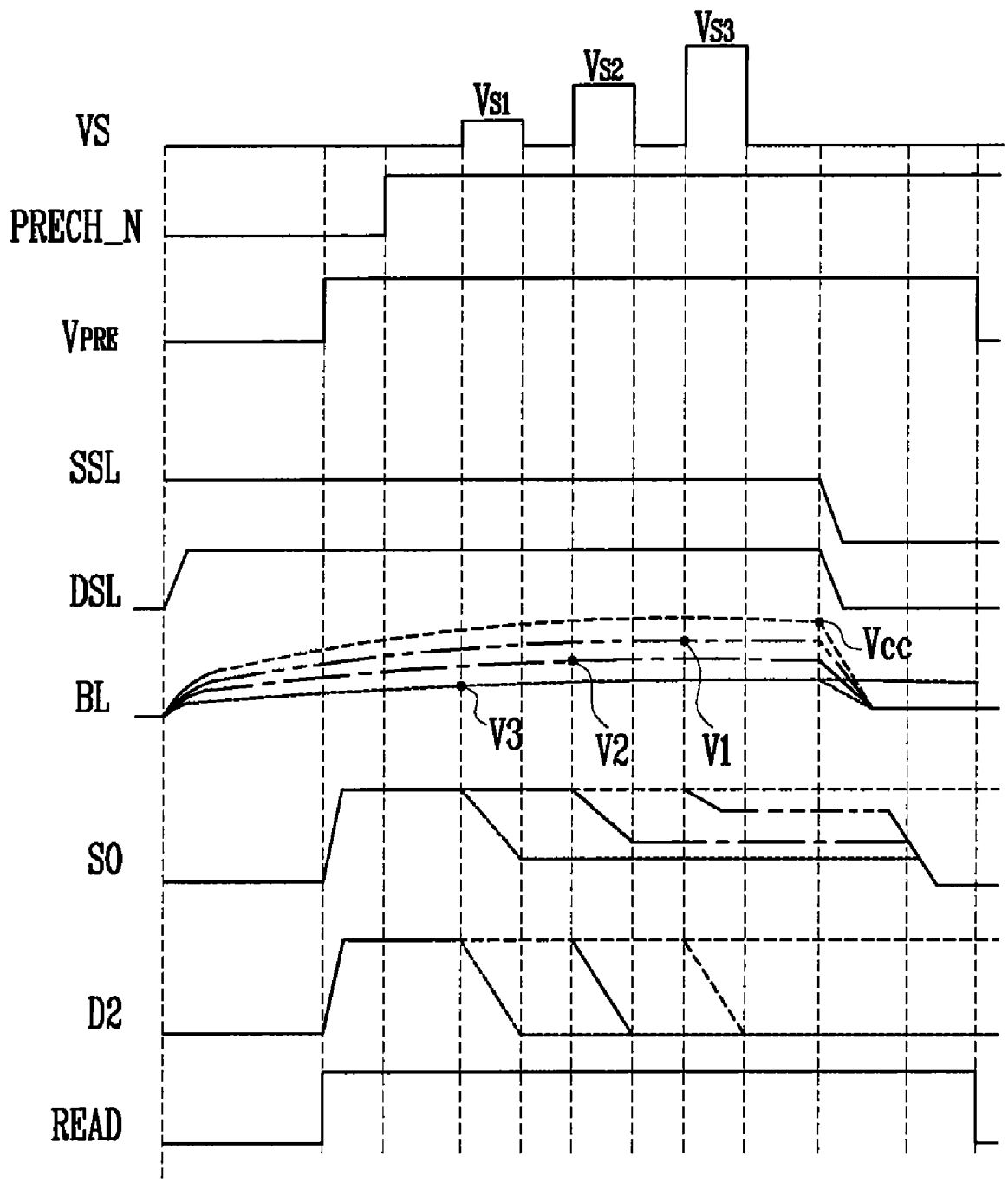
FIG. 4 is an operation timing diagram of the page buffer according to the first embodiment of the present invention.

FIG. 4 is an operation timing diagram of the page buffer according to the first embodiment of the present invention.

FIG. 4 is a timing diagram according to an operation of the flash memory device constructed as shown in FIG. 2b. Assumption is given as follows and the timing diagram is described below. The threshold voltage Vth of all unselected cells and transistors will not be described in this example as they are not needed. Further, MLCs according to an embodiment of the present invention can store 2-bit data and have threshold voltage distributions of a first state [11], a second state [10], a third state [00] and a fourth state [01].

Further, cells having the first state are cells that have not been programmed, and have a threshold voltage of 0 V or less. It is assumed that threshold voltages of cells having the second state include a first threshold voltage $V_{t1}$, the threshold voltage of cells having the third state has a second threshold voltage $V_{t2}$, and the threshold voltage of cells having the fourth state has a third threshold voltage $V_{t3}$.

In addition, the bit line BL connected to cells having the first to third threshold voltages $V_{t1}$ to $V_{t3}$ is precharged to first to third voltage levels V1 to V3, and the bit line BL connected to a cell having the first state is precharged to about the voltage level of Vcc.

On the other hand, sensing voltages for verifying cells having the first to fourth states can be defined as follows: a first sensing voltage $V_{S1}$ for verifying cells having the fourth state, a second sensing voltage $V_{S2}$ for verifying cells having the third state, and a third sensing voltage $V_{S3}$ for verifying cells having the second state. In the present embodiment, that the cells that have not been verified after using the third sensing voltage are deemed to be cells having the first state.

In this case, the voltage levels between the precharge voltages V1 to V3 of the bit line BL and the sensing voltages can be expressed in the following Equation 2.

$$0 < V3 < V_{S1} < V2 < V_{S2} < V1 < V_{S3}, \text{ where } V_{S3} < Vcc$$

The above characteristics are listed in the following Table.

| Cell state | Threshold voltage | BL voltage | Sensing voltage |
|---|---|---|---|
| 1[11] | 0 V or less | Vcc − Vt | Vcc |
| 2[10] | $V_{t1}$ | V1 | $V_{s3}$ |
| 2[00] | $V_{t2}$ | V2 | $V_{s2}$ |
| 4[01] | $V_{t3}$ | V3 | $V_{s1}$ |

A verify operation of a MLC having these characteristics according to an embodiment of the present invention is described below with reference to FIG. 4. In order to perform a program and verification, the second node D2 of the first latch L1 is set to a low level and the first node D1 of the first latch L1 is set to a high level.

As the precharge signal PRECH_N is applied as a low level, the sensing node SO is precharged to Vcc. The precharged sensing node SO turns off the second PMOS transistor P2.

Thereafter, the signals SSL and DSL for turning on the first and second NMOS transistors N1 and N2 are applied as a high level, a selected word line is applied with the highest verify voltage, and unselected word lines are applied with the pass voltage. Further, the common source line GL is applied with the regulated voltage VDC.

The bit line BL is precharged to the first to third voltage levels V1 to V3 or the power supply voltage according to the threshold voltage of a selected cell by apply the voltage VDC.

Thereafter, of the verify control signal VC is raised to the first to third sensing voltages 0 to $V_{S3}$, turn-on/off is performed according to the precharge level of a corresponding bit line BL. Accordingly, as voltage precharged to the sensing node SO is shared, the second PMOS transistor P2 is turned on/off to perform verification.

In more detail, threshold voltage distribution states of each cell are described below.

The verify method according to an embodiment of the present invention includes verifying a cell of the fourth state, which has the highest threshold voltage. Since cells having the fourth state, that is, the state [01] have the third threshold voltage V$_{t3}$, the bit line is precharged to the third voltage V3.

Therefore, if the voltage level of the verify control signal VC is set to the first sensing voltage V$_{S1}$, the third NMOS transistor N3 is turned on and the voltage precharged to the sensing node SO is shared with the third voltage V3 of the bit line, so that the voltage of the sensing node SO drops to a low level. Further, as the second PMOS transistor P2 is turned on, the second node D2 changes to a high level.

Although means connected to the first node D1 (or the third node D3) or second node D2 (or the fourth node D4) and configured to output a verify signal is not additionally shown in FIG. 2b (or FIG. 2c) according to an embodiment of the present invention, the verify signal can be output from a transistor or the like.

If the second node D2 is changed, the second node D2 is changed according to the first sensing voltage. Thus, it is verified that a selected cell has been programmed with the fourth state (that is, [01]).

In the case of the third state (that is, [00]), in the same manner as the cell verify method of the fourth state, the bit line is precharged to the second voltage V2 by means of the second threshold voltage V$_{t2}$ of the cell of the third state.

Furthermore, if the voltage level of the bit line select signal BSL is applied as the first sensing voltage V$_{S1}$ for the purpose of verification, the third NMOS transistor N3 is not turned on since the second voltage V2 is higher than the first sensing voltage V$_{S1}$ as illustrated in Equation 2.

Further, if the level of the verify voltage is raised to the second sensing voltage V$_{S2}$, the third NMOS transistor N3 is turned on since the second sensing voltage V$_{S2}$ is higher than the second voltage V2. Accordingly, as the second voltage V2 and the precharge voltage of the sensing node SO are shared, the voltage level of the sensing node SO is lowered.

Furthermore, the second PMOS transistor P2 is turned on and the second node D2 changes to a high level. Thus, it is verified that a current cell has been programmed with the third state.

Figure 5A:
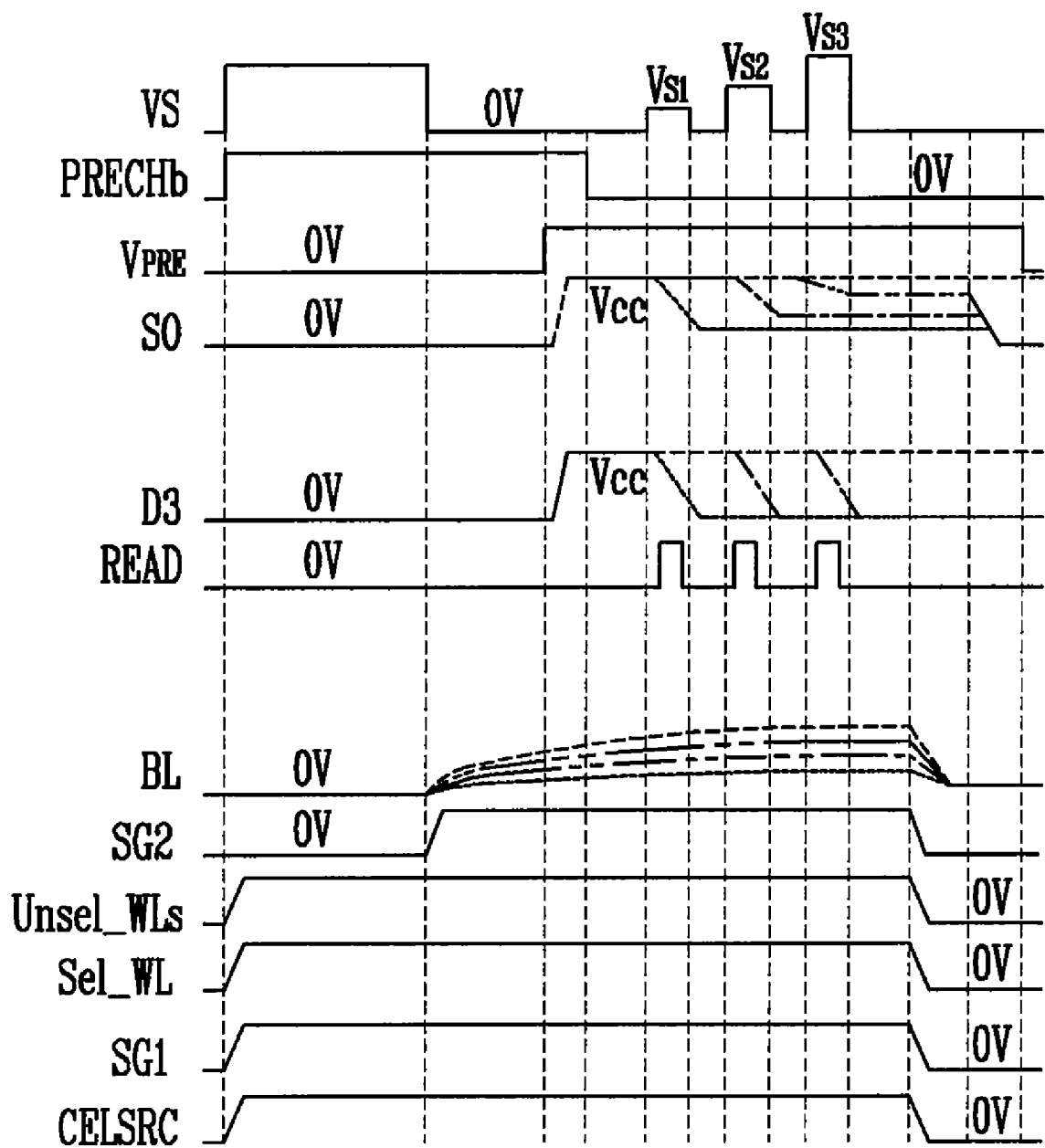
FIGS. 5a and 5b are operation timing diagrams of the page buffer according to the second embodiment of the present invention.
Figure 5B:
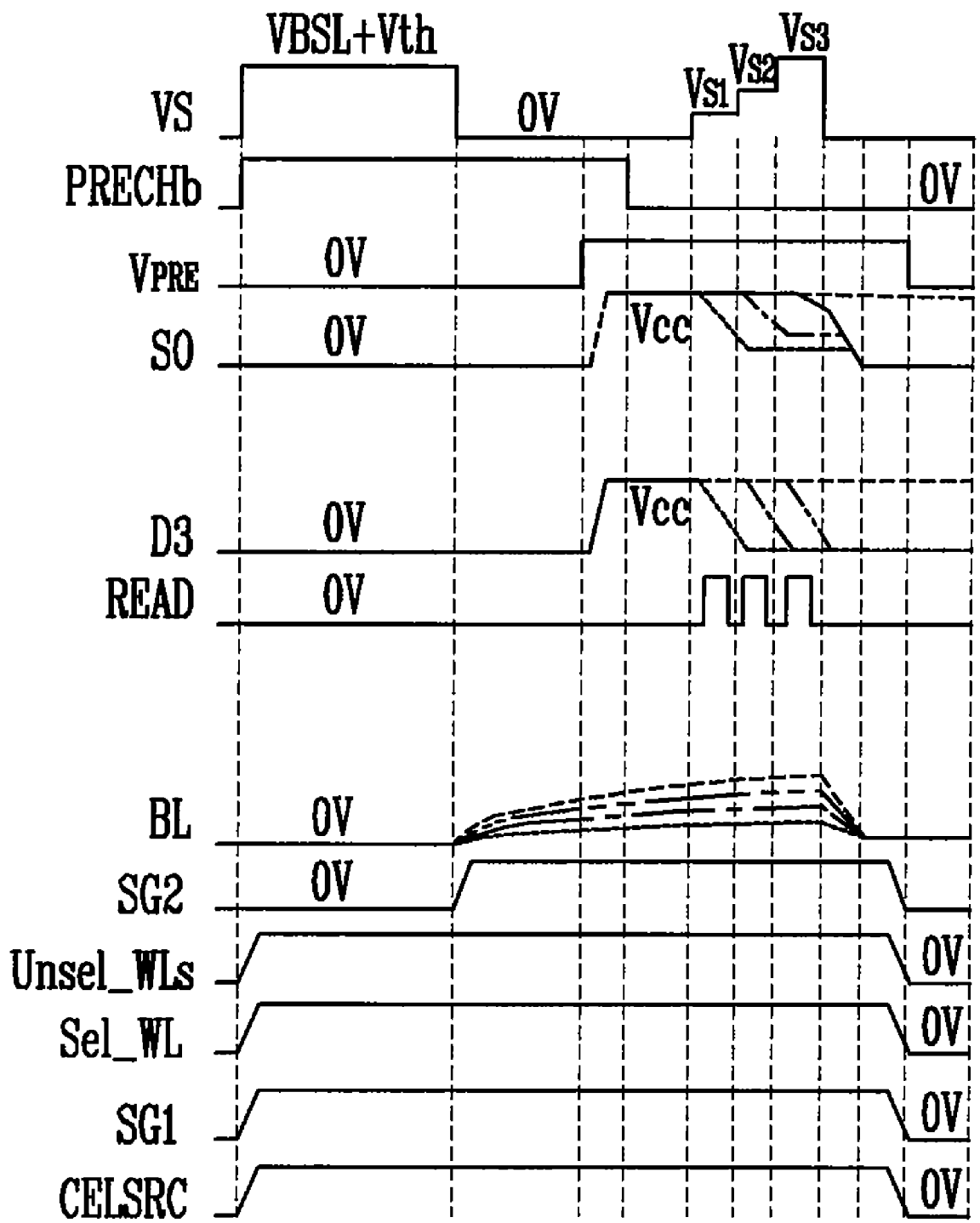

FIGS. 5a and 5b are operation timing diagrams of the page buffer according to the second embodiment of the present invention. FIGS. 5a and 5b are timing diagrams when methods of changing the control signal level differ from each other.

In particular, FIG. 5a is a timing diagram employing a method of, in raising the voltage level of the verify control signal VC, provided to the verify controller 261, to the first to third sensing levels V$_{S1}$ to V$_{S3}$, providing the first sensing level V$_{S1}$, applying the second sensing level V$_{S3}$ again after the voltage level is lowered to 0V, lowering the voltage level to 0V, and finally providing the third sensing level V$_{S3}$. FIG. 5b is a timing diagram employing a method of sequentially raising the voltage level of the verify control signal VC, provided to the verify controller 261, to the first to third sensing levels V$_{S1}$ to V$_{S3}$ step by step. The process of precharging the bit line BL is the same as that described with reference to FIG. 4, and description thereof is omitted.

After the bit line BL is precharged, the voltage level of the control signal VC is applied as the first to third sensing levels V$_{S1}$ to V$_{S3}$. At this time, the method of applying the voltage level may use the method of FIGS. 5a and 5b as described above.

The third NMOS transistor N3 of the verify controller 261 is turned on according to a voltage level precharged to the bit line BL and a voltage level of the control signal VC, so a voltage of the sensing node SO is changed.

As mentioned above, if the voltage of the sensing node SO is changed, the inversion unit 225 senses the changed voltage of the sensing node SO and changes the output of the sensing node SO to a high level, so the fifth NMOS transistor N5 is turned on. Further, if the read signal READ is input, data of the fourth node D4 is changed, so it can be verified that the cell has been programmed. In FIGS. 5a and 5b, there may differ in a program verify time according to the method of changing and applying the sensing level of the verify control signal VC.

As described above, according to an embodiment of the present invention, the bit line is precharged to the threshold voltage of a programmed cell, and the bit line select signal is applied by raising the level of a sensing voltage on a step basis. Accordingly, programmed states depending on cell threshold voltages of several levels can be confirmed with one program pulse.

As described above, in accordance with the memory device and the program verify method according to the present invention, in a memory device including MLCs, verification can be performed on MLCs with respect to one program pulse. It is therefore possible to reduce a verification time and a program time.

Although the foregoing description has been made with reference to the specific embodiment, it is to be understood that changes and modifications of the present patent may be made by the ordinary skilled in the art without departing from the spirit and scope of the present patent and appended claims.

What is claimed is:

1. A program verify method of a memory device, the method comprising:
    performing programming on a selected memory cell of the memory device;
    applying a power supply voltage to a ground line commonly connected to cell strings to which the memory cells are connected for precharging a selected bit line based on a program state of the selected memory cell of the cell strings upon program verification;
    applying a first voltage to a selected word line of a plurality of word lines connected to intersect the cell strings of the memory cells and applying a pass voltage to unselected word lines, precharging each of bit lines by supplying the power supply voltage to the ground line commonly connected to the cell strings;
    sequentially applying a bit line select signal to a gate of a transistor connected between the bit line and a page buffer according to a preset voltage level, and confirming a verify signal of the page buffer, which is output according to each voltage level; and
    determining whether the memory cells have been programmed according to a voltage level of the bit line select signal on which the verify signal is output based on the confirmation result.

2. The program verify method of claim 1, wherein the first voltage includes a voltage enough to turn on even a cell having the highest threshold voltage, of the memory cells.

3. The program verify method of claim 1, wherein a sensing voltage is set to the lowest voltage level with respect to a memory cell having the highest threshold voltage, of the memory cells.

4. The program verify method of claim 1, wherein the verify signal of the page buffer is output when a voltage level of the bit line select signal is higher than a voltage precharged to the bit line.

5. The program verify method of claim 1, wherein the program verification method is performed in order from cells having a high threshold voltage to cells having a low threshold voltage, of the memory cells, as a voltage level of the bit line select signal sequentially rises.

* * * * *